United States Patent
Banna et al.

(10) Patent No.: US 10,553,398 B2
(45) Date of Patent: Feb. 4, 2020

(54) POWER DEPOSITION CONTROL IN INDUCTIVELY COUPLED PLASMA (ICP) REACTORS

(71) Applicant: APPLIED MATERIALS, INC., Santa Clara, CA (US)

(72) Inventors: Samer Banna, San Jose, CA (US); Tza-Jing Gung, San Jose, CA (US); Vladimir Knyazik, Palo Alto, CA (US); Kyle Tantiwong, San Jose, CA (US); Dan A. Marohl, San Jose, CA (US); Valentin N. Todorow, Palo Alto, CA (US); Stephen Yuen, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 408 days.

(21) Appl. No.: 14/463,205

(22) Filed: Aug. 19, 2014

(65) Prior Publication Data
US 2015/0068682 A1 Mar. 12, 2015

Related U.S. Application Data

(60) Provisional application No. 61/874,666, filed on Sep. 6, 2013.

(51) Int. Cl.
*H01J 37/32* (2006.01)
(52) U.S. Cl.
CPC ..... *H01J 37/32119* (2013.01); *H01J 37/3211* (2013.01)
(58) Field of Classification Search
CPC ............. H01J 37/32119; H01J 37/3211; H01J 37/3244; H01J 2237/334; H01J 37/321
See application file for complete search history.

(56) References Cited

U.S. PATENT DOCUMENTS 6,230,651 B1 * 5/2001 Ni ........................ H01J 37/3244
118/723 I
6,451,161 B1 9/2002 Jeng et al.
(Continued)

FOREIGN PATENT DOCUMENTS

| CN | 102280338 A | 12/2011 |
|----|-------------|---------|
| EP | 1 349 196 A2 | 1/2003 |

(Continued)

OTHER PUBLICATIONS

International Search Report and Written Opinion dated Nov. 27, 2014 for PCT Application PCT/US2014/053077.
(Continued)

*Primary Examiner* — Yuechuan Yu
(74) *Attorney, Agent, or Firm* — Moser Taboad; Alan Taboada

(57) ABSTRACT

Embodiments of inductively coupled plasma (ICP) reactors are provided herein. In some embodiments, a dielectric window for an inductively coupled plasma reactor includes: a body including a first side, a second side opposite the first side, an edge, and a center, wherein the dielectric window has a dielectric coefficient that varies spatially. In some embodiments, an apparatus for processing a substrate includes: a process chamber having a processing volume disposed beneath a lid of the process chamber; and one or more inductive coils disposed above the lid to inductively couple RF energy into and to form a plasma in the processing volume above a substrate support disposed within the processing volume; wherein the lid is a dielectric window comprising a first side and an opposing second side that faces the processing volume, and wherein the lid has a dielectric coefficient that spatially varies to provide a varied power coupling of RF energy from the one or more inductive coils to the processing volume.

20 Claims, 4 Drawing Sheets

(56) References Cited

U.S. PATENT DOCUMENTS

| | | | |
|---|---|---|---|
| 7,685,965 B1 * | 3/2010 | Hao | H01J 37/32623 118/723 I |
| 2005/0257891 A1 | 11/2005 | Goto et al. | |
| 2008/0121178 A1 * | 5/2008 | Bang | H01J 37/3244 118/723 I |
| 2012/0031560 A1 * | 2/2012 | Koshimizu | H01J 37/32623 156/345.33 |
| 2013/0102155 A1 | 4/2013 | Gang et al. | |

FOREIGN PATENT DOCUMENTS

| | | | |
|---|---|---|---|
| JP | 05273425 A | * | 10/1993 |
| JP | 06104210 A | * | 4/1994 |
| JP | 2003-282448 | | 10/2003 |
| JP | 2004-228272 | | 8/2004 |
| JP | 2010251708 A | * | 11/2010 |
| KR | 10-2010-0048326 | | 5/2010 |

OTHER PUBLICATIONS

Search Report for Taiwan Invention Patent Application No. 103128848 dated Apr. 11, 2018.
Search Report from the State Intellectual Property Office of the People's Republic of China for China Application No. 2017107549954 dated Oct. 26, 2018.

\* cited by examiner

POWER DEPOSITION CONTROL IN INDUCTIVELY COUPLED PLASMA (ICP) REACTORS

CROSS-REFERENCE TO RELATED APPLICATIONS

This application claims benefit of U.S. provisional patent application Ser. No. 61/874,666, filed Sep. 6, 2013, which is herein incorporated by reference in its entirety.

FIELD

Embodiments of the present invention generally relate inductively coupled plasma processing reactors.

BACKGROUND

Typical industrial inductively coupled plasma (ICP) sources uses an arrangement of two flat or vertical coils to control the plasma profile center to edge (for example, with respect to a substrate being processed) and allow uniformity tunability at the substrate level during processing, for example, in etch applications. In typical vertical, two-coil arrangements where the currents are flowing in the same direction (to be denoted as "in phase"), due to the nature of the constructive interference in the electric field between the coils at the substrate level, an M-shaped etch rate profile exists which limits the overall uniformity that may be desired for advanced node technologies. The location of the peak of the M-shaped etch rate profile in the power coupling under the dielectric window can vary based on the arrangement of the coils. If the currents in the coils are driven in the opposite direction from each other (to be denoted as "out of phase"), destructive interference in the electric field takes place between the coils, thus creating a null region under the dielectric window that isolates the ICP source from the vacuum chamber. Through diffusion, the overall plasma profile at the substrate level can be flattened, eliminating or reducing the M-shape signature. In such a scenario, the plasma is being pushed out towards the chamber walls. Hence, the overall ion flux reaching the substrate might be reduced, causing lower etch rates and reduced throughput. Therefore, to increase the etch rate, higher RF power is needed in out of phase operation. As some applications suffer from the M-shape effect, which, due to high throughput requirements and/or limitation of the RF power supply max power, further requires high ICP power, the out of phase operation may require significantly higher power which might require RF generators and matches that are not commercially available and extremely expensive. Moreover, under certain conditions, out of phase operation might run into capacitive coupling (E Mode) and/or inductive coupling (H mode) instabilities which narrow the window of operation for such processes.

Accordingly, the inventors believe there is a need to mimic the out of phase operation without resorting to higher power and by achieving the same effect in a different manner. Thus, the inventors propose a way to reduce M shape mimicking the out of phase operation while keeping in phase currents by manipulating the power coupling profile (power absorbed by plasma under the dielectric window).

SUMMARY

Embodiments of inductively coupled plasma (ICP) reactors are provided herein. The inventors have discovered that changing the effective dielectric coefficients and/or changing the dielectric window thickness in localized areas between the coils in the plasma creation region of the reactor, can mimic the effect of out of phase operation, for which a null region (or almost null region) of power coupling is created between the coils. Several embodiments are provided to affect the overall power coupling between the coils in the plasma creation region (e.g., the processing volume of the ICP reactor). For example, in some embodiments, the thickness of a dielectric window separating the coils from the processing volume can be increased at a location between the coils where the M peaks (from the vacuum side). For example, as shown in the power profile in FIG. 6, the peak 602 of the M-Shaped profile created by in-phase operation in a dual coil ICP reactor may be controlled and suppressed to near-null peak 604 using embodiments described herein. Alternatively or in combination, a dielectric window can be provided having a radially varying dielectric coefficient such that the dielectric coefficient peaks by about 2-3 times in the region in between the coils. In the embodiments described above, the impact of the inductive and the capacitive coupling through the coils can be affected.

Embodiments of inductively coupled plasma (ICP) reactors are provided herein. In some embodiments, a dielectric window for an inductively coupled plasma reactor includes: a body including a first side, a second side opposite the first side, an edge, and a center, wherein the dielectric window has a dielectric coefficient that varies spatially.

In some embodiments, an apparatus for processing a substrate includes: a process chamber having a processing volume disposed beneath a lid of the process chamber; and one or more inductive coils disposed above the lid to inductively couple RF energy into and to form a plasma in the processing volume above a substrate support disposed within the processing volume; wherein the lid is a dielectric window comprising a first side and an opposing second side that faces the processing volume, and wherein the lid has a dielectric coefficient that spatially varies to provide a varied power coupling of RF energy from the one or more inductive coils to the processing volume.

In some embodiments, an apparatus for processing a substrate includes: a process chamber having a processing volume disposed beneath a lid of the process chamber, wherein the lid is a dielectric window having a dielectric coefficient that varies spatially; a substrate support disposed in the processing volume; and an outer coil and an inner coil disposed above the lid to inductively couple RF energy into the processing volume above the substrate support; wherein the dielectric coefficient of the dielectric window is greatest at a location beneath an area disposed between the outer and inner coils.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
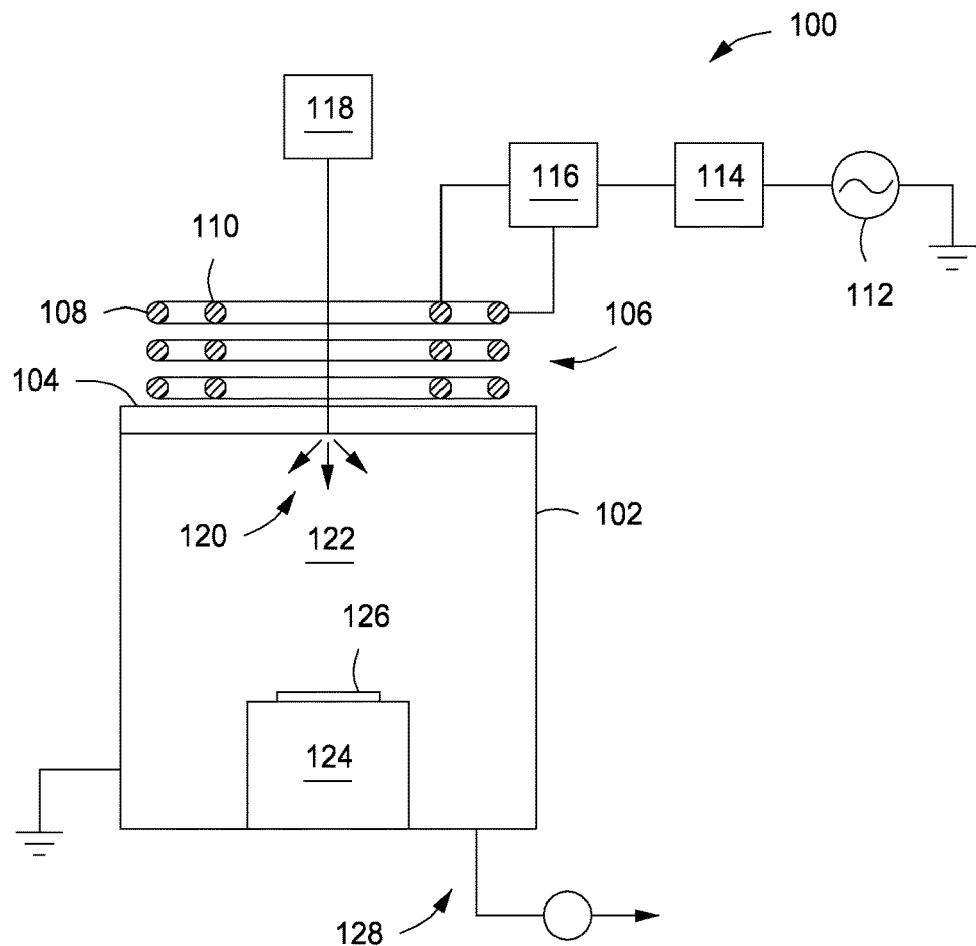
FIG. 1 depicts a schematic view of an illustrative inductively coupled plasma (ICP) reactor in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of inductively coupled plasma (ICP) reactors are provided herein. The inventors have discovered that changing the effective dielectric coefficients, and/or dielectric window thickness, between the coils in the plasma creation region of the reactor can mimic the effect of out of phase operation, for which a null region of power coupling is created between the coils. Several embodiments are provided for increasing the effective dielectric coefficients between the coils in the plasma creation region (e.g., the processing volume of the ICP reactor). For example, in some embodiments, the thickness of a dielectric window separating the coils from the processing volume can be increased at a location between the coils where the M peaks (from the vacuum side). The shape, dimension, and location of such thickness variations can vary of the dielectric window. For example, in some embodiments, the dielectric window can be a tapered lid with a thickness that varies radially. Alternatively or in combination, a dielectric window can be provided having a radially varying dielectric coefficient such that the dielectric coefficient peaks by about 2 to about 3 times in the region in between the coils.

FIG. 1 depicts a schematic view of an illustrative apparatus for processing a substrate, namely, an inductively coupled plasma (ICP) reactor 100 in accordance with some embodiments of the present invention. The ICP reactor 100 generally includes a process chamber 102 (e.g., a vacuum chamber) generally enclosing a processing volume 122. A substrate support 124 is disposed within the process chamber 102 to support a substrate 126 in position within the processing volume 122. The ICP reactor 100 further includes a pair of inductive coils 106 including an outer coil 108 and an inner coil 110 disposed proximate a lid of the process chamber 102 to couple RF energy into the processing volume 122. In some embodiments, the ICP reactor 100 may include only one cylindrical coil. In other embodiment, the ICP reactor 100 may include three or more cylindrical and concentric coils. In all embodiments, the cylindrical coils may be disposed in a flat or vertical position. The lid of the process chamber 102 includes a dielectric window 104 disposed between the inductive coils 106 and the processing volume 122. The dielectric window 104 facilitates coupling RF energy supplied to the inductive coils 106 to a gas supplied to the processing volume 122 in order to form a plasma in the processing volume 122 and is configured to locally control the plasma power coupling as described in more detail below.

One or more gas inlets 120 may be provided through the dielectric window 104 to provide a gas from a gas source 118 to the processing volume 122. Alternatively or in combination, one or more gas inlets may be provided in other locations, such as in sidewalls of the process chamber 102, proximate the substrate support 124, or the like. An exhaust 128 is provided to remove the gas and/or process byproducts from the process chamber 102, to facilitate maintaining the process chamber 102 at a desired pressure, or the like. In some embodiments, the one or more gas inlets 120 may act as a dielectric and isolate the coils from the process chamber 102. Thus, in some embodiments, the thickness of the inlet may affect the overall power coupling in the center. In some embodiments, the gas inlet 120 may be a gas nozzle that extends into the process chamber 102 or may be flush with the surrounding dielectric window 104.

RF energy is provided to the inductive coils 106 by an RF generator 112. A matching network 114 is typically provided between the RF generator 112 and the inductive coils 106 to minimize reflected power returning to the RF generator 112. In some embodiments, a power divider 116 may be provided to control an amount of RF energy (e.g., current) respectively coupled to the inner coil 110 and the outer coil 108 of the inductive coils 106. In some embodiments, the operating frequency can vary from about 400 kHz to about 60 MHz, although other frequencies may also be used.

Figure 2A:
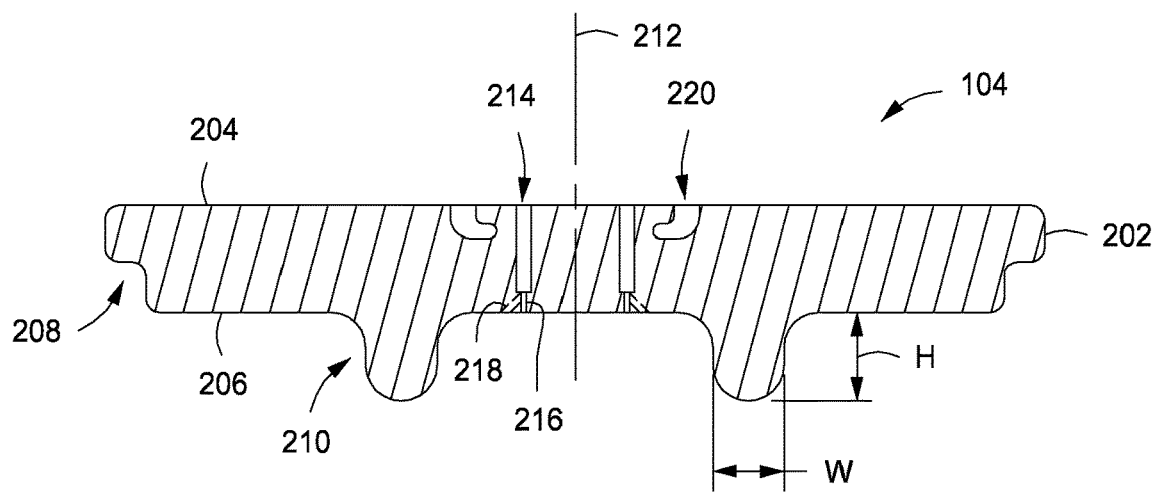
FIGS. 2A-2C depict side cross-sectional views of a dielectric window of an ICP reactor in accordance with some embodiments of the present invention.

FIG. 2A depicts a side cross-sectional view of the dielectric window 104 of the ICP reactor 100 in accordance with some embodiments of the present invention. As shown in FIG. 2, the dielectric window comprises a body 202 having a coil-facing first side 204 and a vacuum-facing second side 206. A ledge 208 may be disposed about the perimeter of the body 202 to facilitate positioning and/or coupling the dielectric window 104 to the body of the process chamber 102. A central portion of the dielectric window 104, inward of the ledge 208, is disposed above and adjacent to the processing volume 122 of the ICP reactor 100. The dielectric window 104 may be fabricated from materials having a suitable dielectric coefficient to facilitate a desired power coupling of RF energy through the dielectric window 104. For example, the dielectric window 104 may be fabricated from ceramic, quartz, or the like. In some embodiments, the dielectric window 104 may be fabricated from aluminum oxide (Al2O3) or Yttria, or could be coated with Yttria. In some embodiments, the dielectric window 104 may be fabricated from any dielectric material with a dielectric coefficient of about 1 to a few tens or hundreds.

Figure 2B:
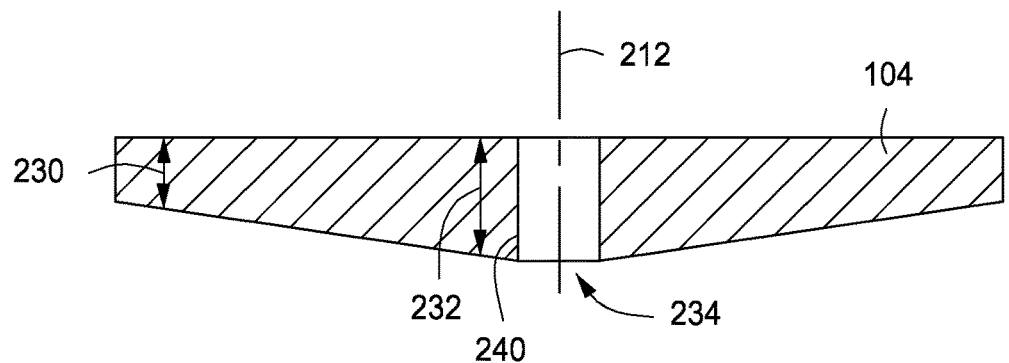
Figure 2C:
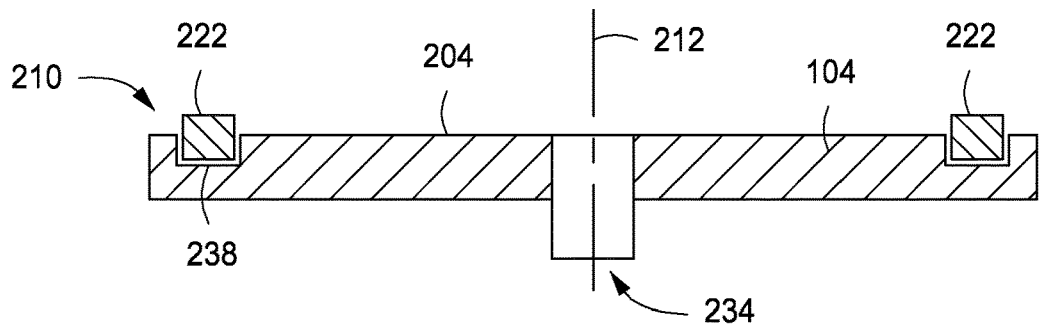

In some embodiments, the dielectric window may have a varying thickness such that the effective dielectric coefficient varies to control the power coupling profile as desired as shown in FIG. 2B. As used herein, the term profile refers to a graph of a parameter with respect to the radial position in the process chamber. Thus, the power coupling profile refers to the magnitude of the RF energy coupled to the plasma as measured just beneath the dielectric window 104 with respect to the radial position as measured from a central axis of the substrate support 124, which corresponds to a central axis 212 of the dielectric window 104, as depicted in FIG. 2A-2C. For example, in some embodiments, the thickness of the dielectric window 104 can be increased (or the dielectric coefficient otherwise increased) at a location (e.g., a first location) beneath an area disposed between the coils, where the "M" of the M-shaped profile peaks. In some embodiments, the dielectric window 104 tapers from the center to the edge, with the greater thickness near the center. Specifically, as shown in FIG. 2B, the width 232 near the center of the dielectric window 104 may be thicker than a width 230 near the inner edge 240 of the dielectric window 104. FIG. 2B also shows a gas nozzle 234 may be flush with the dielectric window 104. The change in the thickness can vary in width, height, and shape.

Figure 3:
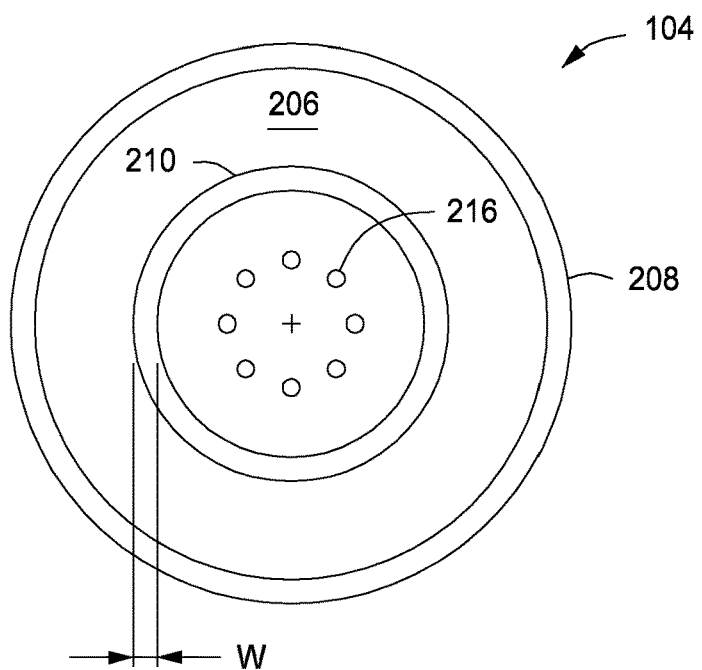
FIG. 3 depicts a bottom view of the dielectric window of FIG. 2 in accordance with some embodiments of the present invention.

In some embodiments, this increased thickness may be provided by one or more protrusions 210 extending from the second side 206 of the body 202 as shown in FIG. 2A. The one or more protrusions 210 may be a single protrusion 210, such as a circle or ring, as depicted in the bottom view of the dielectric window 104 shown in FIG. 3. Although the term ring is used, the protrusion 210 may be square, rectangular, or other polygonal shape, or oval or arc segments or the like. Referring to FIG. 2C, in some embodiments, inserts 222 may be inserted into recesses 238 formed on the first side 204 of the dielectric window 104 to form the one or more protrusions 210. Alternatively, the inserts 222 may not protrude from the first side 204 of the dielectric window 104, but may be fabricated from materials having a greater dielectric coefficient to control the overall dielectric coefficient profile of the dielectric window 104

The protrusion 210 may have a width W (measured parallel to the second side 206) of up to about 4 inches, for example, from about 0.1 to about 5 inches. The protrusion 210 may have a height H (measured perpendicular to the second side 206) of up to about 4 inches, for example, from about 0.1 to about 5 inches. The protrusion 210 may be positioned in any desired location, from the center of the dielectric window to the edge of the dielectric window. In some embodiments, the protrusion is positioned in a location disposed beneath a position between the outer coil 108 and the inner coil 110. In some embodiments, the protrusion 210 could be one-piece machined with the dielectric window 104. In other embodiments, the protrusion 210 could be separately machined and bonded to the dielectric window 104. The protrusion 210 and the dielectric window 104 could be made out of the same material or different materials.

The protrusion 210 may be integral with the body 202 or may be a separate component coupled to the body 202. When separate, the protrusion 210 may be coupled to the body 202 in any suitable manner, such as by bonding. When separate, the protrusion may be fabricated from the same material as the body or from a different material and may have the same dielectric coefficient as the body or a different dielectric coefficient than the body. For example, in some embodiments, the protrusion may have a different dielectric coefficient such that the dielectric coefficient of the dielectric window at the protrusion is greater than the dielectric coefficient of the dielectric window in other areas, for example, but not limited, by about 2 to about 3 times (e.g., a highest value of the dielectric coefficient is about 2 to about 3 times a lowest value of the dielectric coefficient).

In some embodiments, the dielectric window 104 may include integral gas inlets 214 ending in openings 216 fluidly coupled to the processing volume 122. The openings 216 may be configured to direct the gas in a desired direction, such as perpendicularly into the processing volume 122 (as shown by openings 216), or at a non-perpendicular angle into the processing volume 122 (as shown by openings 218 in phantom). One or more features, such as channel 220 may be provided to facilitate coupling other components to the first side 204 of the dielectric window 104, such as a partial enclosure to form a plenum to distribute the gas from the gas source 118 to the gas inlets 214. In some embodiments, the gas inlets 214 can be added to the window through the opening in the center of the dielectric window 104, or could be integrated into the window 104 as a showerhead.

Figure 4:
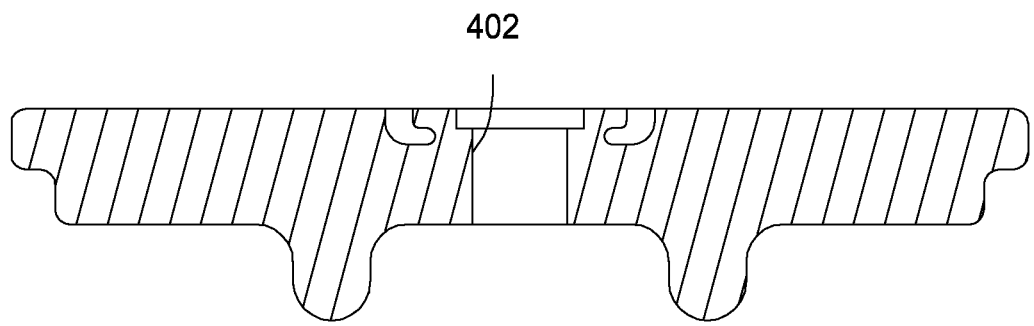
FIG. 4 depicts a side cross-sectional view of a dielectric window of an ICP reactor in accordance with some embodiments of the present invention.

In some embodiments, a nozzle insert having gas inlets may be provided rather than the integral gas inlets 214. For example, FIG. 4 depicts a side cross-sectional view of the dielectric window 104 in accordance with some embodiments of the present invention. As shown in FIG. 4, an opening 402 is provided to irreplaceably provide a nozzle insert for the dielectric window 104.

Figure 5A:
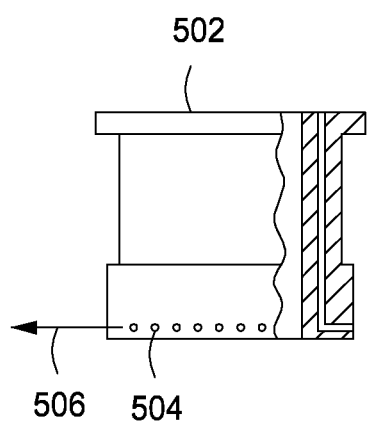
FIGS. 5A-C depict side views in partial cross-section of a nozzle insert of a dielectric window in accordance with some embodiments of the present invention.
Figure 5B:
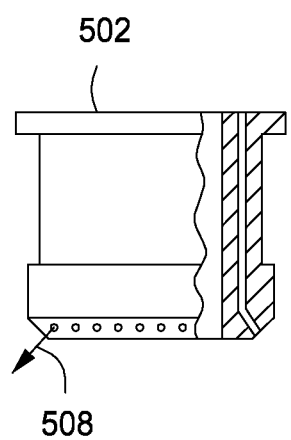
Figure 5C:
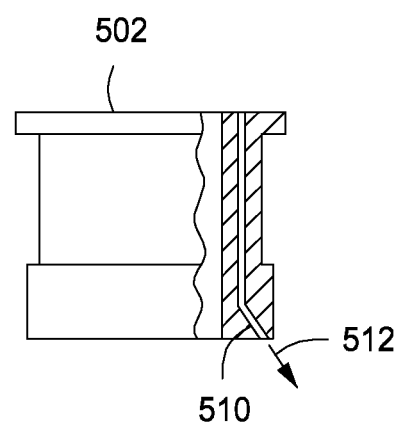
Figure 6:
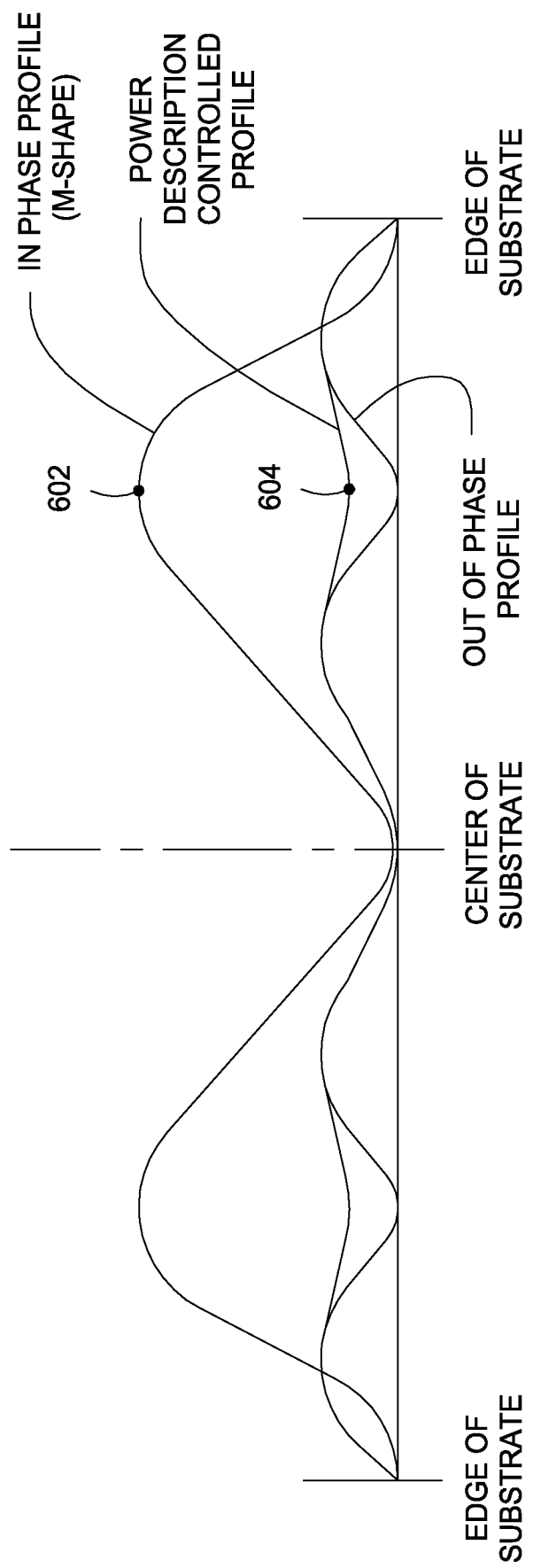
FIG. 6 depicts a power profile in accordance with some embodiments of the present invention.

FIGS. 5A-C depict side views in partial cross-section of nozzle inserts for a dielectric window, for example, the dielectric window of FIG. 4, in accordance with some embodiments of the present invention. FIG. 5A depicts a nozzle insert 502 having a plurality of gas distribution holes 504 (e.g., gas inlets) that direct the gas into the processing volume 122 parallel or substantially parallel to the dielectric window 104 (as indicated by arrow 506). FIG. 5B depicts a nozzle insert 502 having a plurality of gas distribution holes 504 that direct the gas into the processing volume 122 at about 45 degrees with respect to the dielectric window 104 (as indicated by arrow 508). FIG. 5C depicts a nozzle insert 502 having a plurality of gas distribution holes 504 that direct the gas into the processing volume 122 an about 30 degree angle with respect to the dielectric window 104 (as indicated by arrow 512). As shown in phantom in FIG. 5C, gas distribution holes 510 may be disposed in the nozzle insert 502 at any desired angle by connecting to a vertical hole disposed in the nozzle insert 502. In some embodiments, the nozzle insert 502 may include single or multiple injection zones, each of which can be configured to inject gas vertically, horizontally or at any predetermined angle.

The nozzle insert 502 may have a length such that the gas distribution holes are flush with the dielectric window 104 or extend past the second side 206 of the dielectric window 104 (e.g., into the processing volume 122). The nozzle insert may extend into the processing volume 122 up to, but not limited to, about 2 inches. In some embodiments, the nozzle insert 502 may be flush with the surrounding dielectric window 104. Having the nozzle flush with the dielectric window 104 advantageously increases the power coupling in the center which can mitigate the M-shape effect by increasing the center, facilitating improvement of the overall center to edge range despite the presence of M-shape profile.

While the foregoing is directed to embodiments of the present invention, other and further embodiments of the invention may be devised without departing from the basic scope thereof.

The invention claimed is:

1. A dielectric window for an inductively coupled plasma reactor having an outer coil and an inner coil disposed above the dielectric window to inductively couple RF energy into a processing volume disposed beneath the dielectric window, comprising:
   a body including a first side, a second side opposite the first side, an edge, and a center,
   wherein the dielectric window has a dielectric coefficient that varies spatially and the dielectric coefficient of the dielectric window is increased at a location beneath an area disposed between the outer coil and the inner coil but the dielectric coefficient of the dielectric window is not increased at locations beneath all areas enclosed by the inner coil, and wherein a channel that extends only partially into the body is formed in the first side proximate the center to facilitate coupling the dielectric window to other components, and wherein the channel includes an axial portion extending partially into the first side of the body from a first end to a second end and a radial portion extending from the second end of the axial portion.

2. The dielectric window of claim 1, wherein the dielectric coefficient varies radially.

3. The dielectric window of claim 1, further comprising:
one or more protrusions extending from the second side of the body that vary the dielectric coefficient of the dielectric window.

4. The dielectric window of claim 1, wherein the body is planar, and further comprising:
a single, circular protrusion formed integrally with and extending from the second side of the body.

5. The dielectric window of claim 1, further comprising:
one or more recesses formed in the first side of the dielectric window,
wherein one or more inserts are disposed in the one or more recesses.

6. The dielectric window of claim 1, further comprising:
an opening formed in the center of the body; and
a nozzle disposed within the opening and having a plurality of gas distribution holes.

7. The dielectric window of claim 6, wherein the gas distribution holes are flush with the second side of the dielectric window.

8. The dielectric window of claim 6, wherein the gas distribution holes extend past the second side of the dielectric window.

9. The dielectric window of claim 6, wherein the plurality of gas distribution holes are fluidly coupled to a corresponding plurality of vertical holes disposed in the nozzle.

10. The dielectric window of claim 1, further comprising:
a plurality of integral gas inlets extending through the body from the first side to the second side.

11. The dielectric window of claim 1, wherein a thickness of the dielectric window tapers from a region near the center of the body toward the edge of the body.

12. The dielectric window of claim 1, wherein the dielectric coefficient varies by provision of one or more protrusions disposed on the second side of the body and further comprising a plurality of gas inlets disposed in and through the body, wherein the plurality of gas inlets are disposed radially inward of the one or more protrusions.

13. The dielectric window of claim 1, wherein a highest value of the dielectric coefficient is about 2 to about 3 times a lowest value of the dielectric coefficient.

14. An apparatus for processing a substrate, comprising:
a process chamber having a processing volume disposed beneath a lid of the process chamber, wherein the lid is a dielectric window having a dielectric coefficient that varies spatially, a first side, and a second side opposite the first side and facing the processing volume, and wherein a channel that extends only partially into a body of the dielectric window is formed in the first side proximate the center to facilitate coupling of the dielectric window to other components, and wherein the channel includes an axial portion extending partially into the first side of the body from a first end to a second end and a radial portion extending from the second end of the axial portion;
a substrate support disposed in the processing volume; and
an outer coil and an inner coil disposed above the lid to inductively couple RF energy into the processing volume above the substrate support;
wherein the dielectric coefficient of the dielectric window is increased at a location beneath an area disposed between the outer and inner coils but the dielectric coefficient of the dielectric window is not increased at locations beneath all areas enclosed by the inner coils.

15. The apparatus of claim 14, wherein a highest value of the dielectric coefficient is about 2 to about 3 times a lowest value of the dielectric coefficient.

16. A dielectric window for an inductively coupled plasma reactor having an outer coil and an inner coil disposed above the dielectric window to inductively couple RF energy into a processing volume disposed beneath the dielectric window, comprising:
a body including a first side, a second side opposite the first side, an edge, and a center, wherein the dielectric window has a dielectric coefficient that varies spatially and the dielectric coefficient of the dielectric window is increased at a location beneath an area disposed between the outer coil and the inner coil but the dielectric coefficient of the dielectric window is not increased at locations beneath all areas enclosed by the inner coil; and
a plurality of gas distribution holes disposed through the body, wherein each gas distribution hole includes a vertical portion extending from the first side to a terminal point between the first and second sides of the body and an angled portion extending from the terminal point of the vertical portion to the second side, wherein the angled portion extends radially outward at an angle of about 45 degrees with respect to the body,
wherein a channel that extends only partially into the body is formed in the first side proximate the center to facilitate coupling the dielectric window to other components, and
wherein the channel includes an axial portion extending partially into the first side of the body from a first end to a second end and a radial portion extending from the second end of the axial portion.

17. The dielectric window of claim 16, wherein the plurality of gas distribution holes and the plurality of vertical holes are formed in the body.

18. The dielectric window of claim 16, further comprising:
an opening formed in the center of the body; and
a nozzle disposed within the opening, wherein the plurality of gas distribution holes and the plurality of vertical holes are formed in the nozzle.

19. The dielectric window of claim 16, wherein the channel is formed in the first side to facilitate coupling to components of a process chamber in which the dielectric window is disposed.

20. The dielectric window of claim 16, wherein the body is planar, and further comprising:
a single, circular protrusion formed integrally with and extending from the second side of the body.

* * * * *